Figure 1:
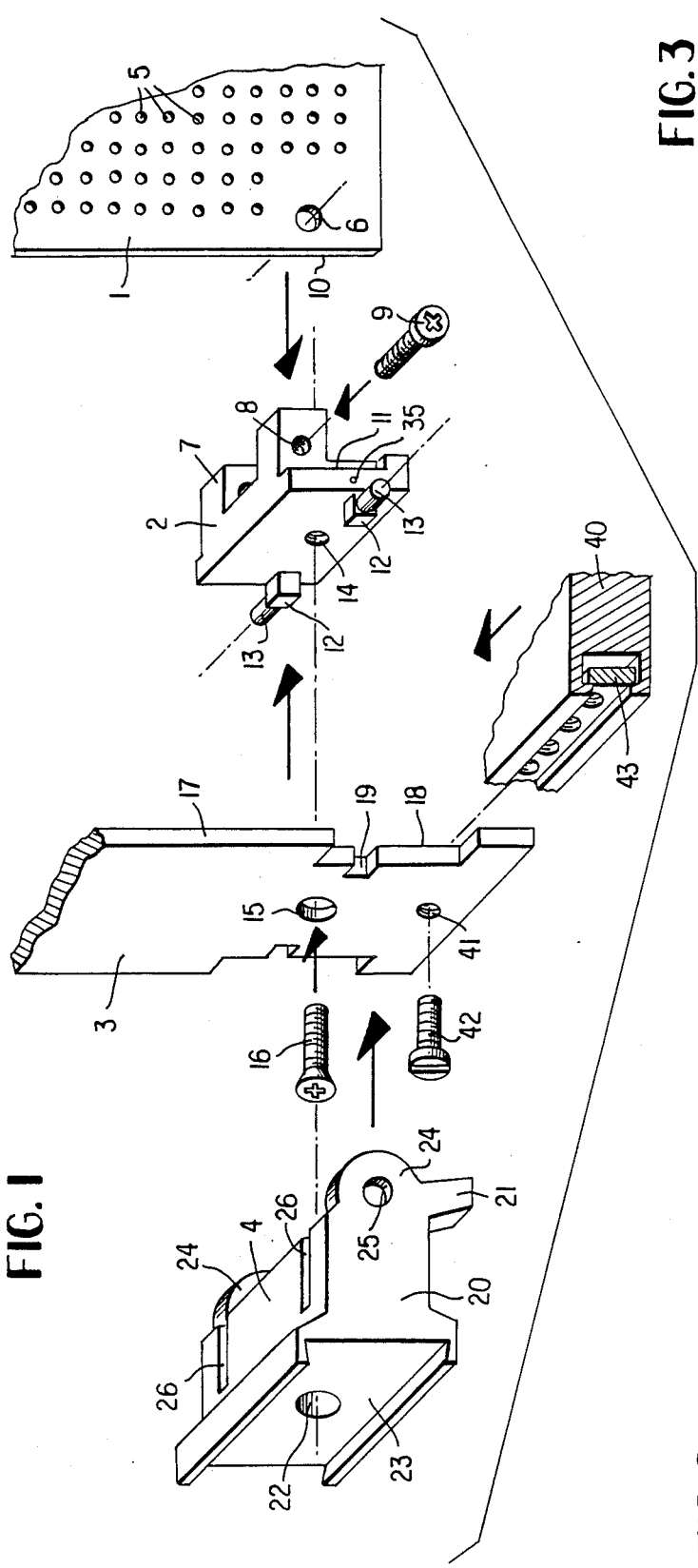

United States Patent [19]

Schwenk et al.

[11] Patent Number: 4,869,678
[45] Date of Patent: Sep. 26, 1989

[54] PLUG-IN MODULE

[75] Inventors: Hans M. Schwenk, Straubenhardt; Paul Mazura, Karlsbad-Spielberg, both of Fed. Rep. of Germany; Eike Waltz, Aptos, Calif.

[73] Assignee: Schroff Gesellschaft mit beschränkter Haftung, Straubenhardt, Fed. Rep. of Germany

[21] Appl. No.: 215,005

[22] Filed: Jul. 5, 1988

[30] Foreign Application Priority Data

Jul. 29, 1987 [EP] European Pat. Off. ........ 87110979.9

[51] Int. Cl.4 ............................................. H05K 1/00
[52] U.S. Cl. ...................................... 439/157; 439/64
[58] Field of Search ............................... 439/152–159, 439/64, 377, 554

[56] References Cited

U.S. PATENT DOCUMENTS

| 1,876,004 | 7/1970 | Andreini et al. | 439/157 |
| 4,064,551 | 12/1977 | Lightfoot | 439/155 |
| 4,183,602 | 1/1980 | Meunier et al. | 439/157 |
| 4,530,615 | 7/1985 | Katsuura . | |
| 4,603,375 | 7/1986 | Miller . | |

FOREIGN PATENT DOCUMENTS

| 0191968 | 8/1986 | European Pat. Off. . |
| 3146904 | 6/1983 | Fed. Rep. of Germany . |
| 3322856 | 6/1986 | Fed. Rep. of Germany . |
| G 8607046 | 6/1986 | Fed. Rep. of Germany . |
| 2115062 | 2/1983 | United Kingdom . |
| 2188196 | 3/1987 | United Kingdom . |

Primary Examiner—David Pirlot
Attorney, Agent, or Firm—Spencer & Frank

[57] ABSTRACT

A plug-in module intended for insertion into component carrier for electronic devices. The module is composed of: a circuit board for supporting electronic and electrical components; a face plate having two longitudinal edges which are fastened at a right angle to the circuit board by means of a bracket; and an extractor including a gripping member which projects from the face plate and has two projecting parallel side walls having bearing holes therein for receiving coaxial hinge pins located in the plane of the face plate so that the extractor is pivotal on the coaxial hinge pins. The longitudinal edges of the face plate have two oppositely disposed recesses for engaging the side walls of the extractor so that the hinge pins are seated in the recesses. The side walls of the extractor may be an integral part of the extractor or separate pieces which are attached to the extractor.

13 Claims, 2 Drawing Sheets

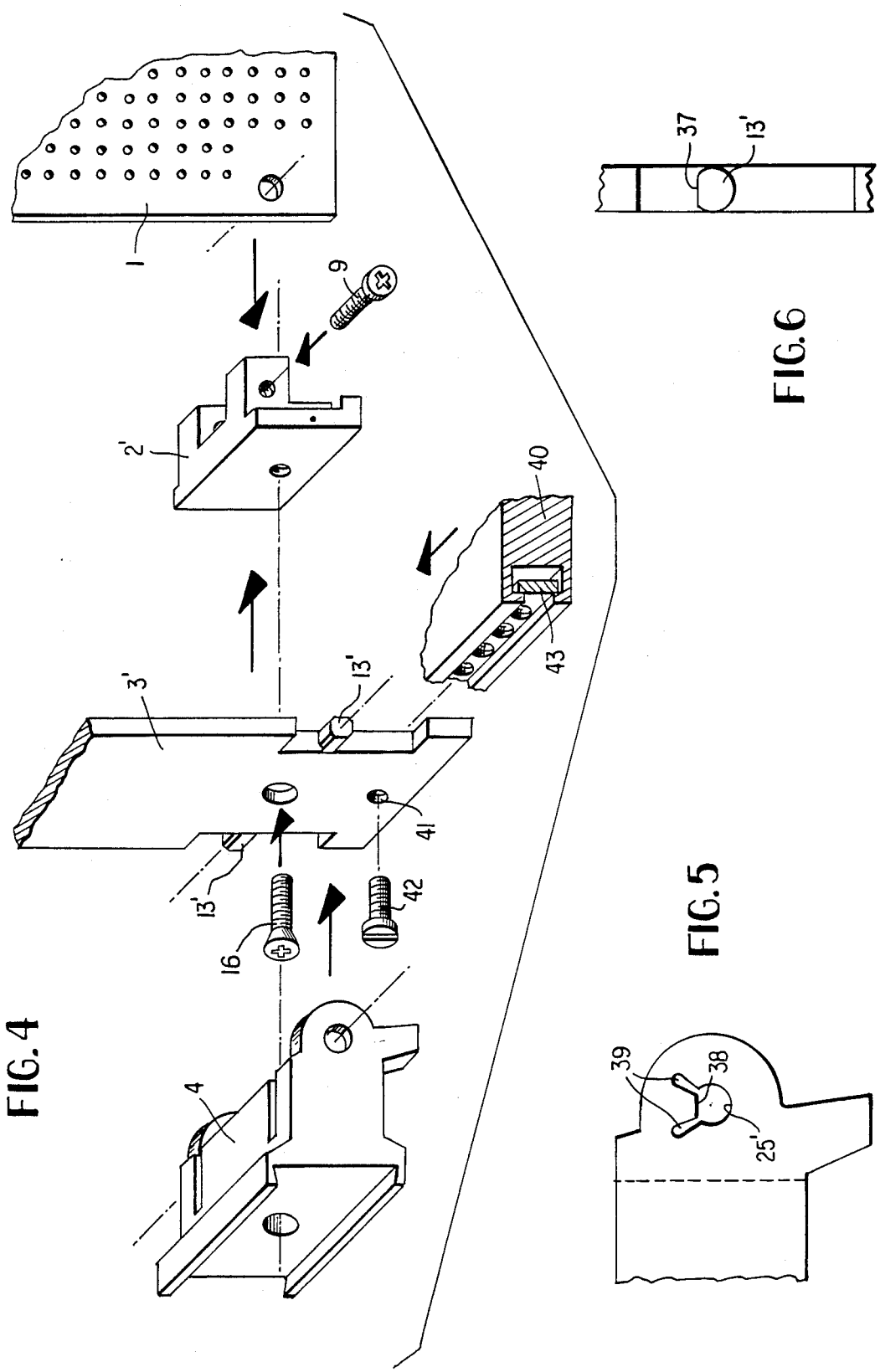

PLUG-IN MODULE

The invention relates to a plug-in module for insertion into module carriers of electronic devices and includes a circuit board which carries electronic and electrical components and is equipped with a plug-in device to which a face plate is fastened at a right angle by means of a bracket. The module further includes an extractor whose gripping member projects from the face plate and which is arranged by means of two long holes disposed at projecting parallel side walls to be pivotal about two coaxial hinge pins disposed in the region of the face plate.

The invention is used in plug-in modules of various sizes which can be inserted into module carriers as they are often used for the assembly of electronic and electrical devices.

Plug-in modules are connected with the module carriers with the aid of multi-pole plug-in connectors. Three-row plug-in connectors having 96 contacts require great force for insertion as ell as extraction; it is hardly possible to remove such plug-in modules from the module carriers without suitable supplementary means.

Lever systems with extraction handles serve as supplementary means for the extraction of plug-in modules. Such lever systems are known in various embodiments. For example, DE-OS No. 3,322,856 discloses a frontal system for plug-in modules which employs costly angle levers equipped with a detent device. U.S. Pat. No. 4,603,375 discloses an ejector for plug-in modules whose gripping member projects through an opening in the face plate and is mounted at a bracket on the fastening screw for the circuit board, thus generating unfavorable leverage forces. DE-GM 8,607,046 discloses a complicated bracket for the circuit board into which the end of the face plate is pushed and which is screwed to the horizontal profile bar of the module carrier.

It is the object of the invention to configure face plate, bracket and extractor in such a manner that these parts are easy to manufacture, that their assembly can be accomplished quickly and that high extraction forces can be realized at the plug-in connector.

To solve the problem at hand, the invention is based on a plug-in module of the above-mentioned type and the problem is solved in that the longitudinal edges of the face plate are provided with two facing recesses in which engage the side walls of the extractor and the two hinge pins are disposed in these recesses and lie in the plane of the face plate. This position of the two hinge pins results in optimum leverage conditions for the extractor.

In one embodiment of the invention, the hinge pins are disposed at the bracket. They are disposed at supporting blocks which project from the bracket and engage in corresponding recesses in the face plate.

To prevent the circuit board from turning, the bracket is provided with a guide edge.

In another embodiment of the invention, the hinge pins are disposed at the face plate and are shaped to it.

To facilitate insertion of the extractor, its side walls are configured as spring tabs which are equipped with the bearing holes. These spring tabs are shaped to the extractor. The same extractor is employed in both embodiments of the invention.

In another embodiment of the extractor, the latter has a lateral recess into which one of the two side walls is inserted in a form-locking manner. This inserted side wall is provided with a mandrel which engages into a blind bore of the extractor. A tab which fits into a groove in the blind bore may be provided at the mandrel. These measures serve to fasten the form-lockingly inserted side wall.

At least one of the two hinge pins may be provided with a detent face on its jacket and the associated bearing hole may be provided with a corresponding counterface and with two laterally following radial slots. With the aid of this detent device, the extractor may be held in an intended position. The same result can be realized in that a raised portion is provided on the side of the bracket so as to face a depression in the side wall.

Entrance slopes may be provided at the bearing holes of the extractor to facilitate placement of the extractor on the two hinge pins.

Figure 3:
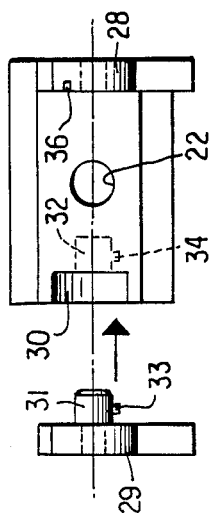
Figure 2:
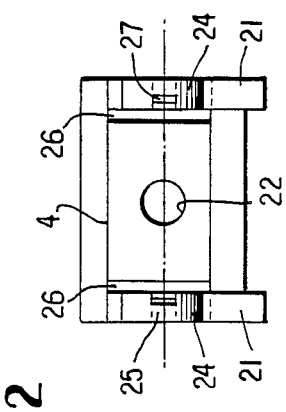

The invention will now be described in greater detail for two embodiments thereof and with reference to the attached drawing figures. The drawing figures show the following:

FIG. 1, a perspective view of a plug-in module, with its details pulled apart in an exploded view, to a scale that is enlarged about two-fold, with the face plate and the circuit board being only partially shown;

FIG. 2, a rear view of the extractor for the plug-in module of FIG. 1;

FIG. 3, a second embodiment of the extractor for the plug-in module of FIG. 1 with an insertable side wall;

FIG. 4, a second plug-in module in which the hinge pins are shaped to the face plate, likewise in a perspective exploded view;

FIG. 5, a side view of part of an extractor equipped with a bearing hole, enlarged with respect to FIG. 4;

FIG. 6, a partial, enlarged view of the face plate of the plug-in module of FIG. 4, likewise seen from the side.

The plug-in module shown in FIG. 1 is essentially composed of four parts, namely a circuit board 1, a bracket 2, a face plate 3 and an extractor 4.

Circuit board 1, shown in a broken-away form, is made of insulating material and is provided with a pattern of holes 5 for the attachment of electronic and electrical components (not shown). In the region of its corner, circuit board 1 is provided with a fastening hole 6 which serves to screw circuit board 1 to bracket 2.

Bracket 2, which is made of a suitable material, for example metal or cast plastic, is provided on its rear side with two parallel holding tabs 7 equipped with threaded bores 8 for a cylinder head screw 9 to screw on circuit board 1. The front edge 10 of circuit board 1 is placed against a guide edge 11 on bracket 2.

On the front side of bracket 2 facing face plate 3, two cube-shaped supporting blocks 12 are disposed, each equipped with an outwardly projecting coaxial hinge pin 13. The two supporting blocks 12 together with hinge pins 13 are shaped to bracket 2.

The front of bracket 2 is equipped with a threaded hole 14. By means of bracket 2, face plate 3 is fastened to circuit board 1 at a right angle.

Face plate 3 which is likewise shown in broken-away form is made of metal or plastic and has a rectangular cross section. It is provided with a fastening hole 15 having a sunk edge; the face plate is screwed to bracket 2 by means of a flat-head screw 16.

At its two longitudinal edges 17, at the same height and thus facing one another, face plate 3 is provided with recesses 18 which have a rectangular cross section.

Square cutouts 19 are provided in these recesses 18. Cutouts 19 correspond with the supporting blocks 12 of bracket 2 in such a manner that, if face plate 3 is screwed to bracket 2, supporting blocks 12 are seated in cutouts 19 and hinge pins 13 stand in recesses 18 of face plate 3, thus also placing them in the plane of face plate 3.

Extractor 4 is made of metal or plastic and includes a gripping member 20 as well as two lever arms 21. Gripping member 20 is penetrated by a through hole 22 through which flat-head screw 16 is accessible. A groove 23 having a dovetail profile serves for the lateral insertion of a cover strip (not shown).

Extractor 4 is provided with two rearwardly projecting parallel side walls 24 which are constructed as spring tabs and in which bearing holes 25 are provided to receive hinge pins 13; thus, extractor 4 is pivotal relative to face plate 3. In order to form spring tabs, extractor 4 is provided with two longitudinal slots 26. The two spring tabs forming side walls 24 engage in recesses 18 of face plate 3.

At bearing holes 25, radially oriented entrance slopes 27 for hinge pins 13 are provided at the inner faces of side walls 24 which are configured as spring tabs - see FIG. 2.

As can be seen in FIG. 3, extractor 4 may also have a fixed, shaped-on side wall 28 and an insertable side wall 29, with the latter fitting into a corresponding lateral recess 30 in a form locking manner. The insertable side wall 29 is then provided with a cylindrical mandrel 31 which engages in a blind bore 32 of extractor 4. A tab 33 is disposed at mandrel 31 to engage in a groove 34.

On the side of bracket 2, a raised portion 35 is provided which cooperates with a depression 36 on the interior of fixed side wall 28.

As shown in FIG. 1 a raised portion 35 may be provided on a side of the bracket 2 to interface with a depression 36 in the side wall 24 or 28 as shown in FIG. 3.

The plug-in module shown in FIG. 4 essentially coincides with that of FIG. 1 except that bracket 2′ as well as face plate 3′ have a different configuration.

Bracket 2′ which connects circuit board 1 with face plate 3′ has an angular profile and is made of metal or plastic.

Hinge pins 13′ at which extractor 4—which coincides with that of FIG. 1—is pivotally disposed are arranged at face plate 3′ and are shaped to it there.

At least one of the two holding pins 13′ may—as shown in FIG. 6—have a detent face 37 at its jacket and the associated bearing hole 25′ (see FIG. 5) may be provided with a corresponding counterface 38 and with two laterally following radially oriented slots 39.

To extract the plug-in module from the component carrier, gripping member 20 of extractor 4 is depressed. This causes the lever arm 21 of extractor 4 to be placed against the horizontal supporting rail 40 of the component carrier and the plug-in module moves forward, while it is being depressed, against the contact holding forces of the plug-in device disposed at circuit board 1 and out of the component carrier.

Near its two lateral ends, face plate 3, 3′ is releasably fastened to the horizontal supporting rail 40 of the—otherwise not shown—component carrier, employing a cylinder head screw 42 which passes through a fastening hole 41. Cylinder head screw 42 engages in a threaded strip 43 inserted into supporting rail 40.

We claim:
1. A plug-in module for insertion into component carriers for electronic devices comprising:
   a circuit board for supporting electronic and electrical components;
   a bracket having two supporting blocks, each said supporting block having a coaxial hinge pin projecting therefrom;
   a face plate having two longitudinal edges and having cutouts for engaging said supporting blocks, said face plate being fastened at a right angle to said circuit board by means of said bracket; and
   an extractor including a gripping member which projects from said face plate and including two projecting parallel side walls having bearing holes therein for receiving said coaxial hinge pins so that said extractor is pivotal on said coaxial hinge pins;
   wherein said longitudinal edges of said face plate have two oppositely disposed recesses for engaging said side walls of said extractor so that said hinge pins are seated in said recesses and lie in the plane of said face plate.

2. A plug-in module according to 1, wherein said bracket includes a guide edge for said circuit board.

3. A plug-in module according to claim 1, wherein at least one of said hinge pins has a detent face and the associated bearing hole has a corresponding counterface and two laterally following radial slots.

4. A plug-in module according to claim 1, wherein said bearing holes include entrance slopes for receiving said hinge pins.

5. A plug-in module according to claim 1, wherein a side of said bracket includes a raised portion and said extractor side wall includes faced a depression for interfacing with said raised portion.

6. A plug-in module according to claim 1, wherein said extractor side walls are configured as spring tabs.

7. A plug-in module according to claim 6, wherein said spring tabs are an integral part of said extractor.

8. A plug-in module for insertion into component carriers for electronic devices comprising:
   a circuit board for supporting electronic and electrical components;
   a bracket;
   a face plate having two longitudinal edges and having cutouts for engaging said supporting blocks, said face plate being fastened at a right angle to said circuit board by means of said bracket;
   two coaxial hinge pins disposed in the plane of said face plate; and
   an extractor having a gripping member which projects from said face plate and two projecting parallel side walls having bearing holes therein for receiving said coaxial hinge pins so that said extractor is pivotal on said coaxial hinge pins;
   wherein said longitudinal edges of said face plate have two oppositely disposed recesses for engaging said side walls of said extractor, said hinge pins are disposed in said recesses and said extractor includes a lateral recess for inserting one of said two side walls into in a form locking manner.

9. A plug-in module according to claim 8 wherein said hinge pins are disposed on said bracket.

10. A plug-in module according to claim 8, wherein said inserted side wall includes with a mandrel and said extractor includes a blind bore for receiving said mandrel.

11. A plug-in module according to claim 10, said mandrel includes a tab and said blind bore includes a groove for receiving said tab.

12. A plug-in module according to claim 8 wherein said hinge pins are disposed on said face plate.

13. A plug-in module according to claim 12 wherein said hinge pins are an integral part of said face plate.

* * * * *